(12) United States Patent
Chidambarrao et al.

(10) Patent No.: US 7,405,436 B2
(45) Date of Patent: Jul. 29, 2008

(54) STRESSED FIELD EFFECT TRANSISTORS ON HYBRID ORIENTATION SUBSTRATE

(75) Inventors: Dureseti Chidambarrao, Weston, CT (US); Judson R. Holt, Wappingers Falls, NY (US); Meikei Ieong, Wappingers Falls, NY (US); Oiging C. Ouyang, Yorktown Heights, NY (US); Siddhartha Panda, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 11/029,797

(22) Filed: Jan. 5, 2005

(65) Prior Publication Data
US 2006/0145264 A1    Jul. 6, 2006

(51) Int. Cl.
*H01L 29/04* (2006.01)
*H01L 21/8238* (2006.01)

(52) U.S. Cl. ............... 257/204; 257/627; 257/E27.108; 257/E21.632; 438/199

(58) Field of Classification Search .................. 257/627; 438/199
See application file for complete search history.

(56) References Cited

U.S. PATENT DOCUMENTS

| | | | |
|---|---|---|---|
| 6,995,456 B2 * | 2/2006 | Nowak | 257/627 |
| 7,176,522 B2 * | 2/2007 | Cheng et al. | 257/338 |
| 2004/0195646 A1 | 10/2004 | Yeo et al. | |
| 2004/0256700 A1 | 12/2004 | Doris et al. | |
| 2005/0285187 A1 * | 12/2005 | Bryant et al. | 257/335 |

FOREIGN PATENT DOCUMENTS

CN    1478297    2/2004

OTHER PUBLICATIONS

M. Yang, et al., "High Performance CMOS Fabricated on Hybrid Substrate with Different Crystal Orientations", IBM Semiconductor Research and Development Center, (2003).
R. Arghavani, et la., "Stress Management in Sub-90-nm Transistor Architecture", IEEE Transactions on Electron Devices, vol. 51, No. 10 (Oct. 2004).

* cited by examiner

*Primary Examiner*—Lex Malsawma
(74) *Attorney, Agent, or Firm*—Scully, Scott, Murphy & Presser, P.C.; Ido Tuchman, Esq.

(57) ABSTRACT

A semiconductor structure having improved carrier mobility is provided. The semiconductor structures includes a hybrid oriented semiconductor substrate having at least two planar surfaces of different crystallographic orientation, and at least one CMOS device located on each of the planar surfaces of different crystallographic orientation, wherein each CMOS device has a stressed channel. The present invention also provides methods of fabricating the same. In general terms, the inventive method includes providing a hybrid oriented substrate having at least two planar surfaces of different crystallographic orientation, and forming at least one CMOS device on each of the planar surfaces of different crystallographic orientation, wherein each CMOS device has a stressed channel.

9 Claims, 7 Drawing Sheets

STRESSED FIELD EFFECT TRANSISTORS ON HYBRID ORIENTATION SUBSTRATE

FIELD OF THE INVENTION

The present invention relates to high-performance semiconductor devices for digital or analog applications, and more particularly to complementary metal oxide semiconductor (CMOS) devices that have mobility enhancement from stress and surface orientation. Specifically, the present invention provides stressed CMOS devices that are located on a hybrid orientated substrate.

BACKGROUND OF THE INVENTION

In present semiconductor technology, CMOS devices, such as nFETs or pFETs, are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have a high mobility for a (110) surface orientation. That is, hole mobility values on (100) Si are roughly 2×-4× lower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

On the other hand, hole mobility on (110) Si is 2× higher than on (100) Si; therefore, pFETs formed on a (110) surface will exhibit significantly higher drive currents than pFETs formed on a (100) surface. Unfortunately, electrons mobility on (110) Si surfaces is significantly degraded compared to (100) Si surfaces.

As can be deduced from the above, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

Hybrid oriented substrates having planar surfaces with different crystallographic orientation have recently been developed. See, for example, U.S. patent application Ser. No. 10/250,241, filed Jun. 23, 2003 and U.S. patent application Ser. No. 10/696,634, filed Oct. 29, 2003. Additionally, hybrid-orientated metal oxide semiconductor field effect transistors (MOSFETs) have recently demonstrated significantly higher circuit performance at the 90 nm technology node. As discussed above, the electron mobility and hole mobility can be optimized independently by placing the nFET on a (100) surface and the pFET on a (110) surface.

Although hybrid oriented substrates having planar surfaces of different crystal orientation can increase the carrier mobility, further improvement is needed in order to keep the performance scaling as devices are being scaled.

Another means to enhance carrier mobility is to introduce a stress into the channel of a MOSFET. Stress can be introduced into a single crystal oriented substrate by several methods including, for example, forming a stress inducing layer on top of the substrate and around the gate region. Although stress inducing layers can be used as a means to enhance carrier mobility, further improvement is still needed.

In view of the drawbacks mentioned above with prior art techniques for improving the carrier mobility, there is still a need for providing a technique that is able to enhance the carrier mobility beyond that which can be achieved utilizing either hybrid oriented substrates, or stress inducing layers.

SUMMARY OF THE INVENTION

The present invention provides semiconductor structures comprised of stressed channels (including uni-axial and/or bi-axial strained channels) on hybrid oriented substrates wherein the combined technologies provide a synergistic improvement in carrier mobility as well as various methods of fabricating the inventive semiconductor structures.

In general terms, the semiconductor structure of the present invention comprises a hybrid oriented semiconductor substrate having at least two planar surfaces of different crystallographic orientation, and at least one CMOS device located on each of the planar surfaces of different crystallographic orientation, wherein each CMOS device has a stressed channel.

The stressed channel may have bi-axial strain from a buffer layer beneath the substrate, it may have uni-axial stress from an embedded stress 'well', it may have a stressed liner on top of the gate region and active area of the substrate, it may contain the stress from the memorized stress from the gate, it may contain the stress induced by trench isolation regions or any combination thereof.

Some embodiments of the present invention include: (1) a stressed well on a hybrid oriented substrate: a tensile stressed well for a nFET (embedded SiC) and/or a compressively stressed well for a pFET (embedded SiGe); (2) stressed liner on a hybrid oriented substrate: a tensile stressed liner for nFET and/or a compressively stressed liner for a pFET; (3) a stressed liner and a stressed well on a hybrid oriented substrate; (4) bi-axial strained channels on a hybrid oriented substrate: a tensile strained channel for a nFET and/or a compressively strained channel for a pFET; (5) bi-axial strained channels on a hybrid oriented substrate, with stressed liners and/or stressed wells; and (6) stressed isolation regions in any of the structures described in (1)-(5).

In addition to providing the semiconductor structures described above in which both a hybrid oriented substrate and stressed channels are present, the present invention also provides various methods of fabricating such structures. In broad terms, the method of the present invention includes providing a hybrid oriented substrate having at least two planar surfaces of different crystallographic orientation and forming at least one CMOS device on each of the planar surfaces of different crystallographic orientation, wherein each CMOS device includes a stressed channel.

DETAILED DESCRIPTION OF THE INVENTION

Figure 1:
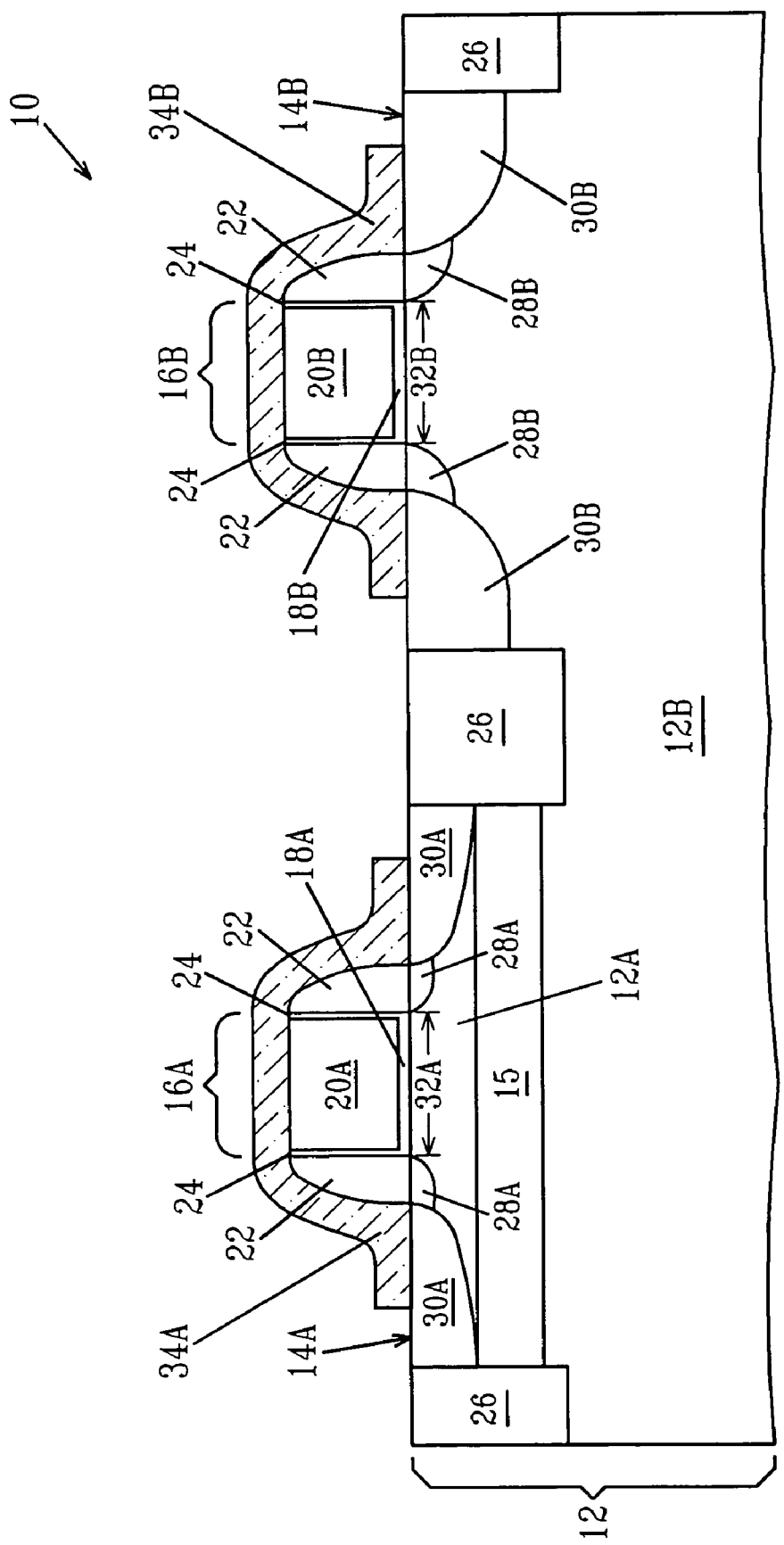
FIG. 1 is a pictorial representation (through a cross sectional view) illustrating one possible semiconductor structure in accordance with the present invention having a tensile stressed liner on a nFET and a compressively stressed liner on a pFET, said nFET and pFET are located on a hybrid oriented substrate having two planar surfaces of different crystallographic orientation.

The present invention, which provides semiconductor structures including stressed channels on a hybrid oriented substrate as well as methods of fabricating the same, will now be described in greater detail by referring to the drawings that accompany the present application. It is noted that the drawings of the present application are provided for illustrative purposes and thus they are not drawn to scale. Moreover, in the drawings, like reference numerals are used in describing like and/or corresponding elements.

As stated above, the present invention provides semiconductor structures including hybrid orientated substrates having at least two planar surfaces of different crystallographic orientation, and at least one CMOS, e.g., a field effect transistor (FET), located on each planar surface of different crystallographic orientation, wherein each CMOS has a stressed channel. FIGS. 1-7 are pictorial representations of various examples of semiconductor structures that fall within the scope of the present invention.

Other semiconductor structures that fall within the scope of the present invention, besides those shown, are also possible and are thus contemplated by the present invention.

A description of the inventive structures shown in each of FIGS. 1-7 will be provided first followed by a discussion of the various materials that are present in the structures. A general discussion of how to fabricate the semiconductor structures of the present invention follows the material discussion provided herein below.

Structures

Reference is first made to the semiconductor structure 10 shown in FIG. 1 which includes a hybrid oriented substrate 12 having two planar surfaces (designated by reference numeral 14A and 14B) of different crystallographic orientation. That is, planar surface 14A has a first crystallographic orientation and planar surface 14B has a second crystallographic orientation wherein the first crystallographic orientation is different from the second crystallographic orientation.

The structure 10 in FIG. 1 also includes one FET 16A located atop the first planar surface 14A and one FET 16B located atop the second planar surface 14B. Each FET includes at least a gate dielectric (18A and 18B, respectively), a gate electrode (20A and 20B, respectively) and at least one sidewall spacer 22. Optionally, the sidewalls of each FET may include a passivation layer 24 located thereon.

The FETs shown in FIG. 1 are located atop the hybrid oriented substrate 12 and are separated by isolation regions 26. Each FET also includes source/drain (S/D) extensions (28A and 28B, respectively) and S/D regions (30A and 30B, respectively). A channel (32A and 32B, respectively) that is stressed is located underneath each FET. In the embodiment illustrated in FIG. 1, the stressed channels are formed by having at least one stressed liner (34A and 34B, respectively) located atop the hybrid oriented substrate 12 and around each FET. Depending on the conductivity type of the FET (i.e., p or n), the stressed liners 34A and 34B can be under tensile stress (preferred for nFETs), or compressive stress (preferred for pFETs).

As shown, the hybrid oriented substrate 12 comprises at least a first semiconductor material 12A and a second semiconductor material 12B. A buried insulating region 15 can optionally be located between each of the semiconductor materials.

Four various embodiments can be derived from the structure illustrated in FIG. 1. In one embodiment, a type A structure is provided that comprises a (110) SOI pFET and a (100) bulk nFET. In a second embodiment, a type B structure is provided that comprises a (100) SOI nFET and a (110) bulk pFET. In a third embodiment, a type C structure is provided that includes a (100) SOI nFET and a (110) SOI pFET. In a fourth embodiment, a type D structure is provided that includes a (100) bulk nFET and a (110) bulk pFET. The type C structure is provided by having a second buried insulating layer present in the hybrid oriented substrate 12 underneath the FET 16B. In any of these embodiments, the stressed liner can include a single material or more than one, e.g., a dual, material stressed liner.

Figure 2:
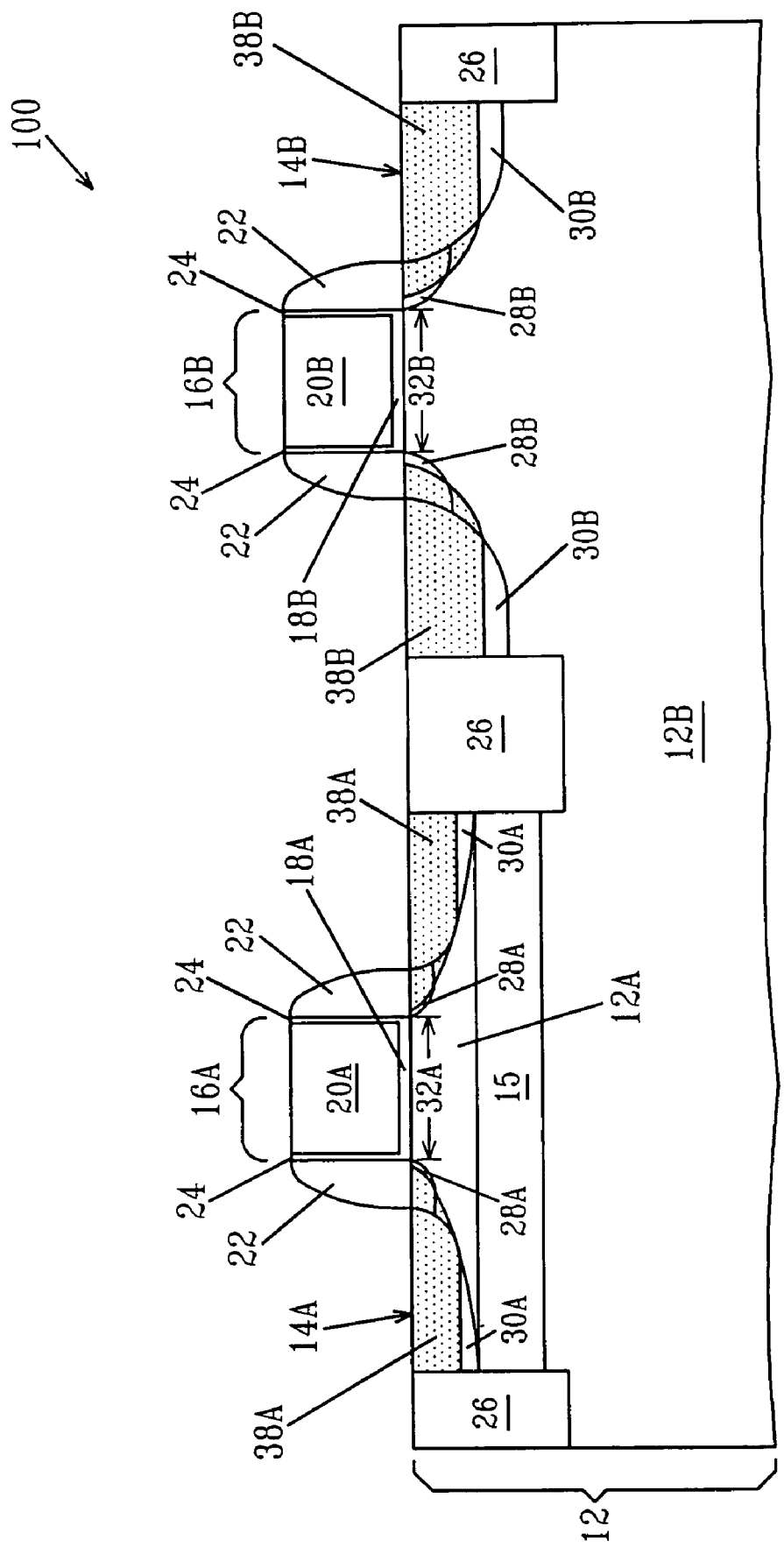
FIG. 2 is a pictorial representation (through a cross sectional view) illustrating one possible semiconductor structure in accordance with the present invention having embedded wells (SiC well for the nFET and SiGe well for the pFET) on a hybrid orientated substrate having two planar surfaces of different crystallographic orientation.

FIG. 2 shows a structure 100 that is similar to the one depicted in FIG. 1 except that the stressed channels (32A and 32B, respectively) are formed by embedded wells (38A and 38B) instead of stressed liners (34A and 34B, respectively).

The embedded wells (38A and 38B) can be used together as shown in FIG. 2 or they can be used singly. Four different embodiments are possible with the structure shown in FIG. 2 including structure A, B, C and D, wherein the designation A, B and C have the meaning described above.

Figure 3:
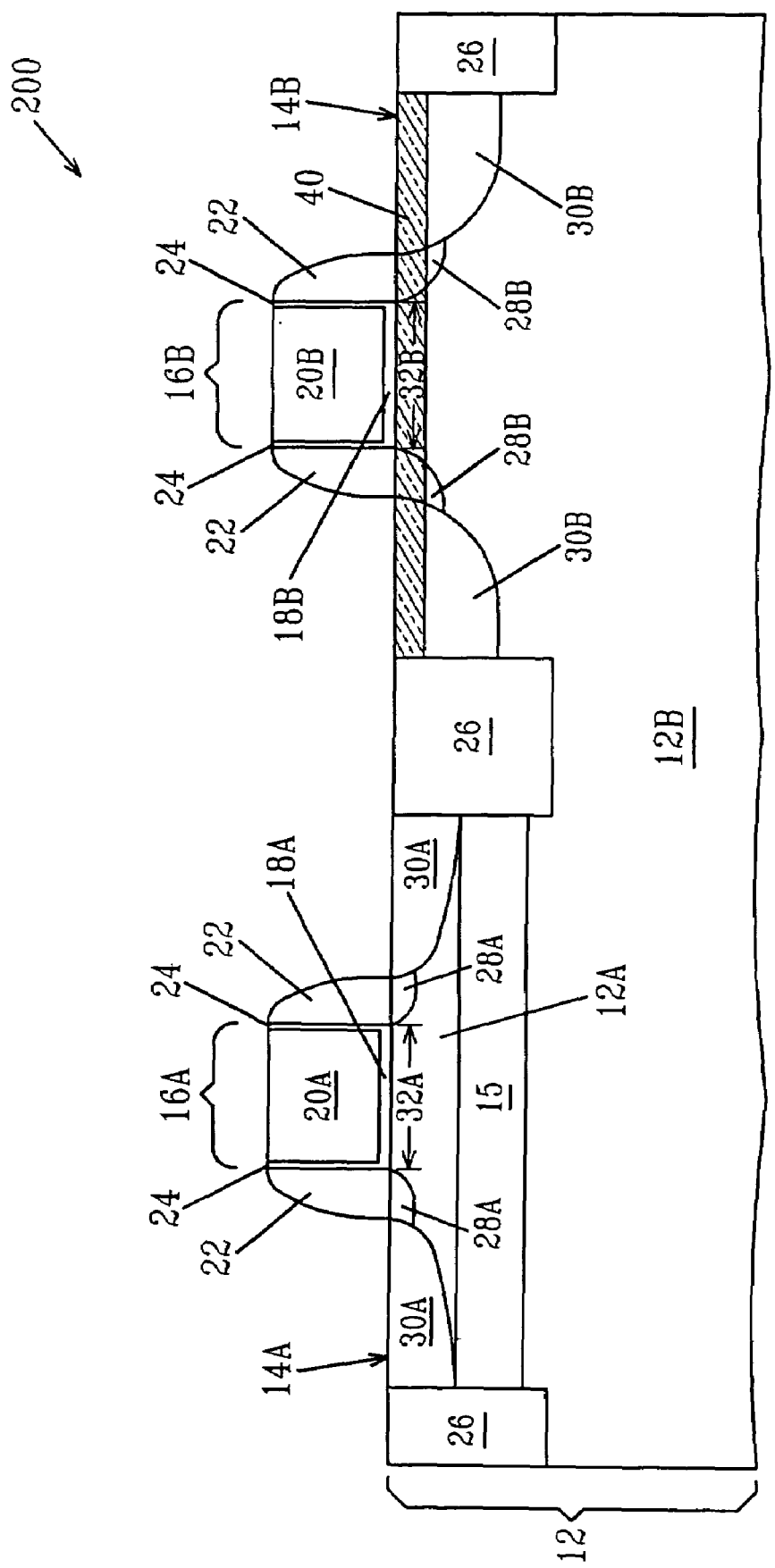
FIG. 3 is a pictorial representation (through a cross sectional view) illustrating one possible semiconductor structure in accordance with the present invention having bi-axial stressed channels on a hybrid oriented substrate having two planar surfaces of different crystallographic orientation.

FIG. 3 shows another possible structure 200 of the present invention which includes bi-axial stressed channels (32A and 32B) in which the stressed channels are a result of the type of semiconductor material present under each FET. The stressed channel can be a tensile strained semiconductor layer, as the first semiconductor 12A, or a compressively strained semiconductor layer 40 as an upper layer of the second semiconductor material 12B. Structure 200 represents a bi-axial stressed channel (32A and 32B) on a hybrid orientated substrate (12).

Figure 4:
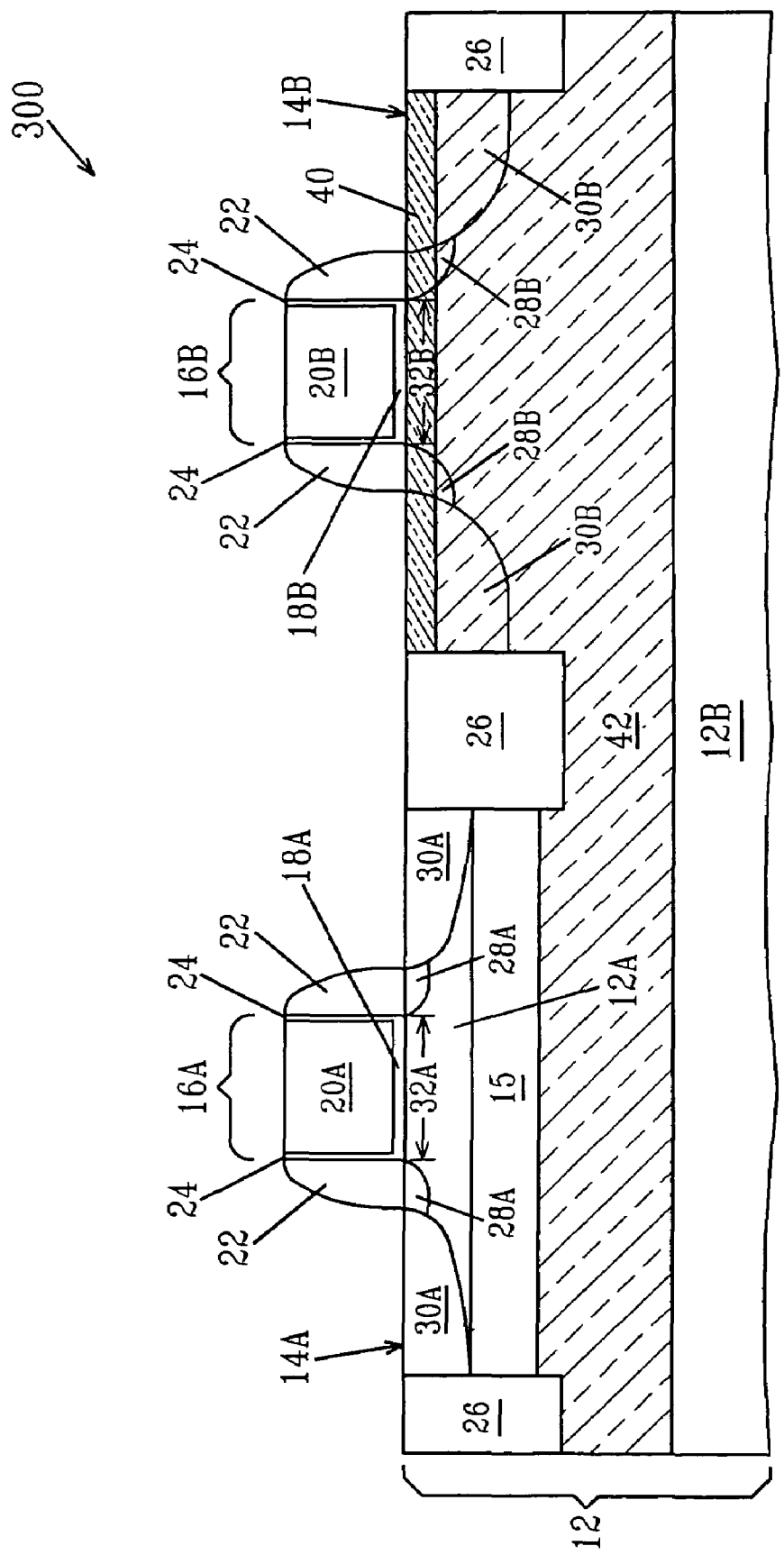
FIG. 4 is a pictorial representation (through a cross sectional view) illustrating one possible semiconductor structure in accordance with the present invention having bi-axial stressed channels on a hybrid oriented substrate having two planar surfaces of different crystallographic orientation.

FIG. 4 shows yet another possible semiconductor structure 300 of the present invention that includes bi-axial stressed channels (32A and 32B) on a hybrid orientated substrate 12. The structure 300 includes the same materials as the structure shown in FIG. 3 except for the presence of a relaxed semiconductor material 42 that is located above the second semiconductor material 12B.

Figure 5:
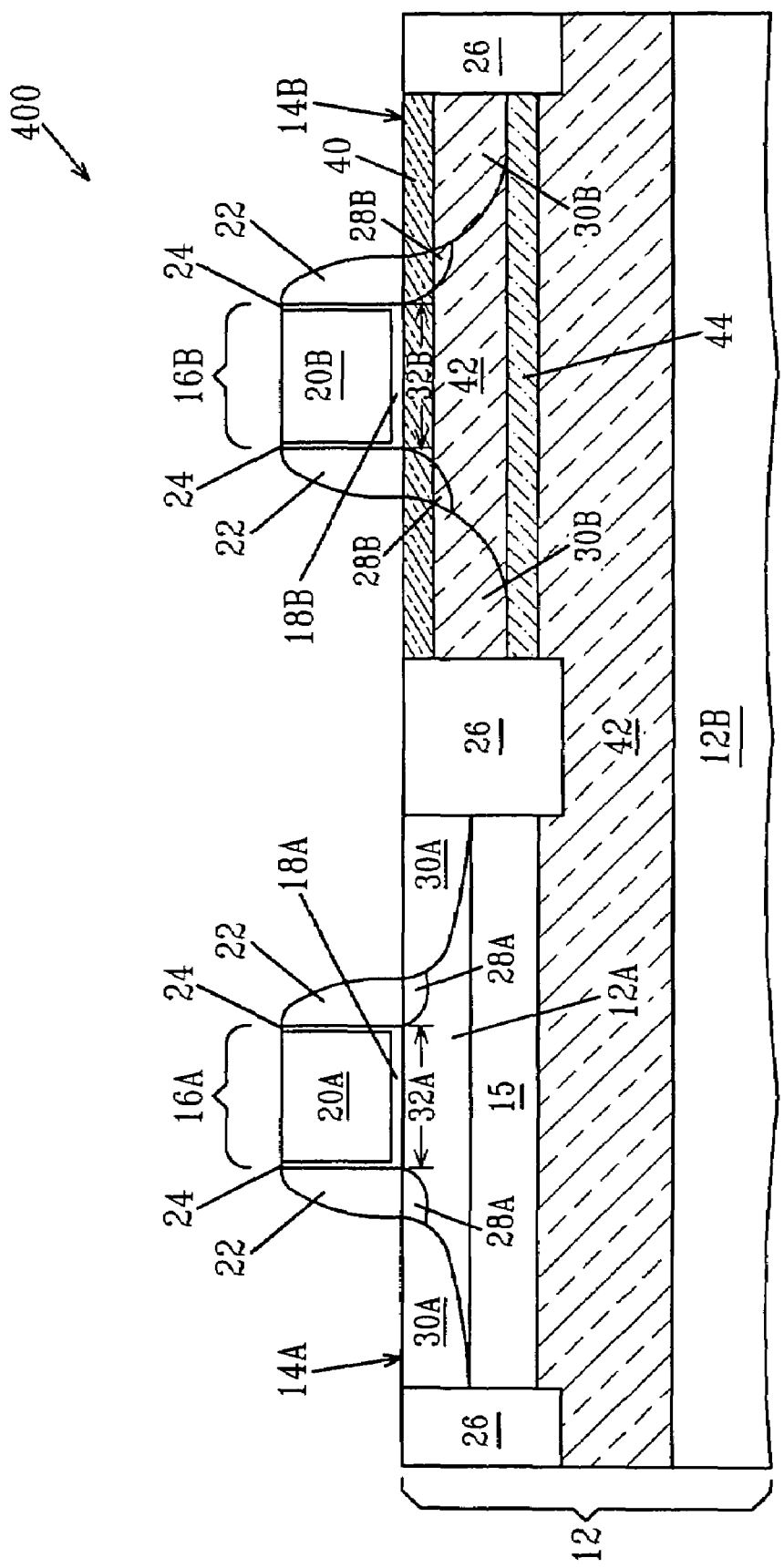
FIG. 5 is a pictorial representation (through a cross sectional view) illustrating one possible semiconductor structure in accordance with the present invention having bi-axial stressed channels on a hybrid oriented substrate having two planar surfaces of different crystallographic orientation.

FIG. 5 shows yet another possible semiconductor structure 400 of the present invention that includes bi-axial stressed channels (32A and 32B) on a hybrid orientated substrate 12. The structure 400 includes the same materials as the structure shown in FIG. 4 except for the presence of a second buried insulating layer 44 that is present in a portion of the relaxed semiconductor material 42.

Figure 6:
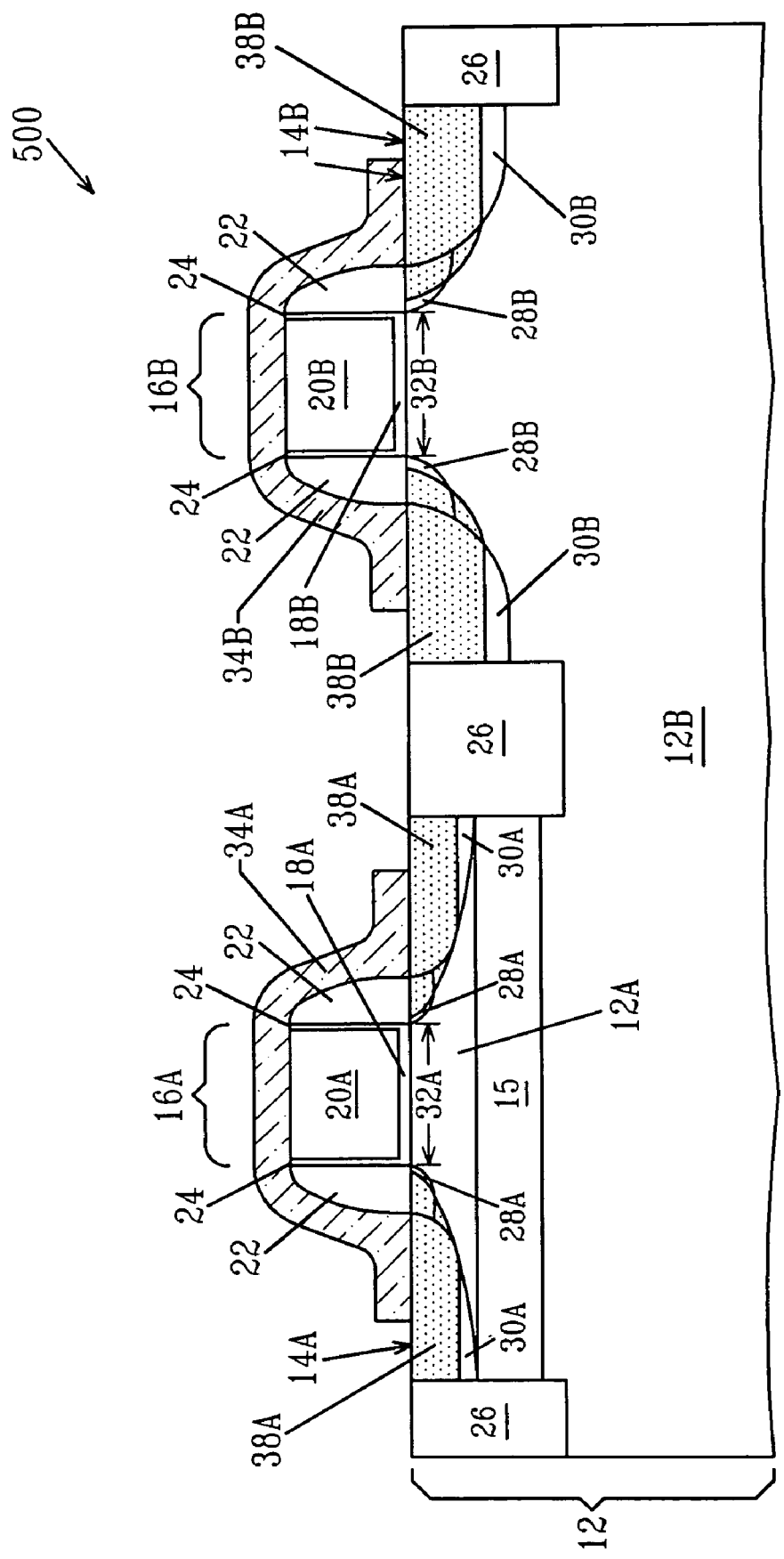
FIG. 6 is a pictorial representation (through a cross sectional view) illustrating one possible semiconductor structure in accordance with the present invention having embedded wells on a hybrid crystal oriented substrate having two planar surfaces of different crystallographic orientation and a stressed liner.

FIG. 6 shows another possible semiconductor structure 500 that includes both stressed liners (34A and 34B) and embedded wells (38A and 38B) which provide stressed channels (32A and 32B) in hybrid orientated substrate 12.

Figure 7:
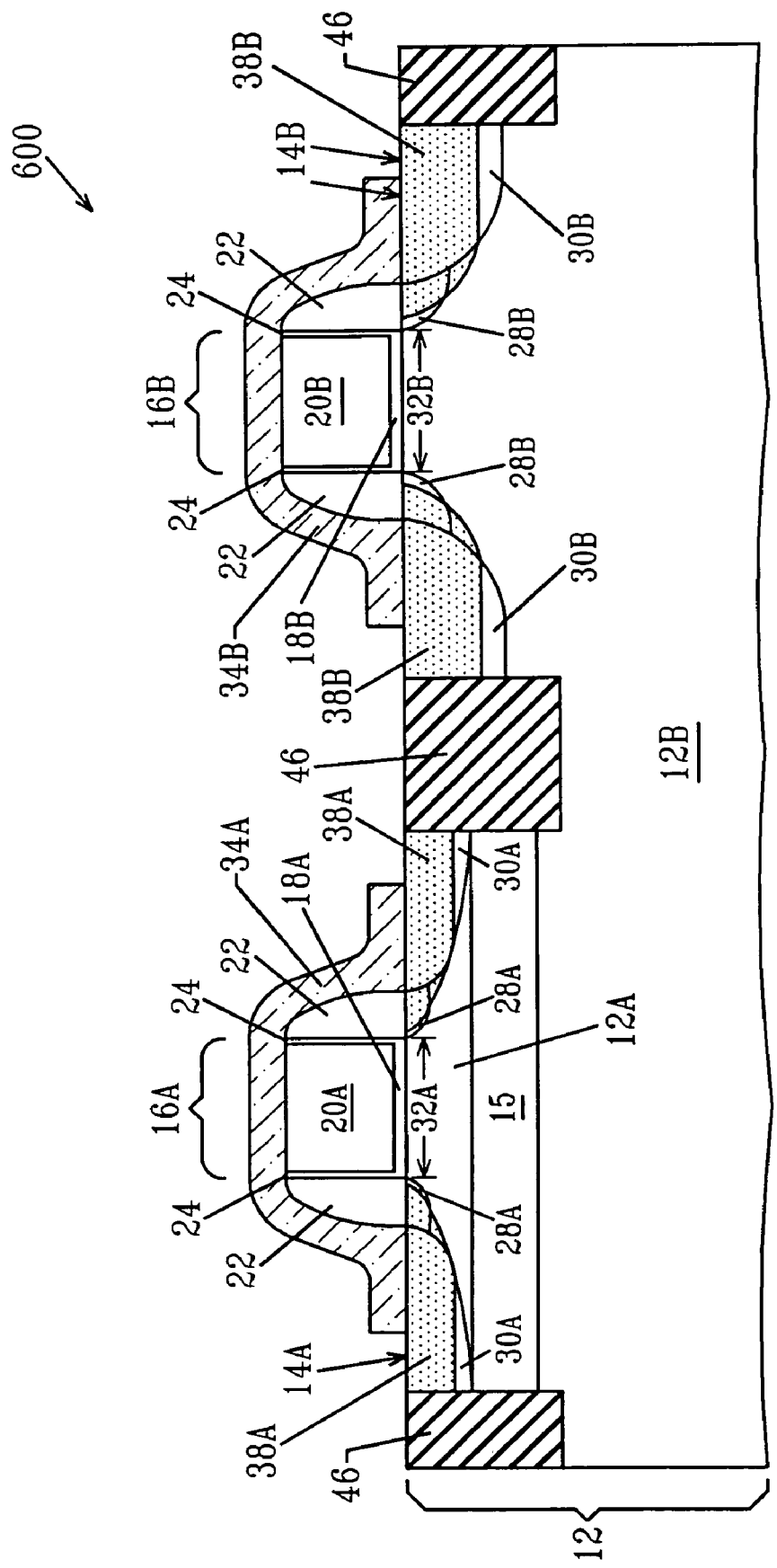
FIG. 7 is a pictorial representation (through a cross sectional view) illustrating one possible semiconductor structure in accordance with the present invention having embedded wells on a hybrid crystal oriented substrate having two planar surfaces of different crystallographic orientation and a stressed liner and stressed isolation regions.

FIG. 7 shows another possible semiconductor structure 600 that includes stressed liners (34A and 34B), embedded wells (38A and 38B) and stress inducing isolation regions 46 which provide stressed channels (32A and 32B) in hybrid orientated substrate 12.

It should be noted that it is possible to form structures A, B, C and D (as defined above) for the structures illustrated in FIGS. 3-7.

Material Components for the Inventive Structures Illustrated in FIGS. 1-7.

This section provides a description of the various materials that can be present in the structures of the present invention.

Common to each of the inventive structures is a hybrid oriented semiconductor substrate 12 that includes at least two planar surfaces (14A and 14B) that have different crystallographic orientation. Illustratively, the first planar surface 14A can have a (100) crystallographic orientation, while the second planar surface 14B can have a (110) crystallographic orientation. Alternatively, the first planar surface 14A can have a (110) crystallographic orientation, while the second planar surface can have a (100) surface. Although other Miller indices (both major and minor) are possible, the two mentioned herein are preferred since the (110) surface provides optimal performance for pFETs, while the (100) surface provides optimal performance for nFETs.

The hybrid oriented semiconductor substrate 12 is typically comprised of a first semiconductor material 12A and a second semiconductor material 12B. The first semiconductor material and the second semiconductor material can be comprised of the same or different semiconductor material. For example, first semiconductor material 12A and second semiconductor material 12B may be comprised of Si, SiC, SiGeC, Ge, GaAs, InAs, InP, as well as other III/V or II/VI compound semiconductors. The second semiconductor material 12B (as well as the first semiconductor material 12A) may include combinations of these aforementioned materials such as a Si located atop a SiGe substrate. In the drawings, semiconductor material 40 and semiconductor material 42 represent cases in which the second semiconductor material 12B includes a combination of semiconductor materials. The second semiconductor material 12B (as well as the first semiconductor material 12A) can be strained, unstrained or a combination of strained and unstrained layers, e.g., strained Si on relaxed SiGe as shown, for example, in FIG. 4. Preferably, the semiconductor material making up hybrid oriented substrate 12 is a Si-containing semiconductor containing for example, Si, SiGe, SiGeC, SiC and combinations thereof. Any of the films may be intrinsic or they may be doped with, for example, but not limited to: B, As, or P.

Buried insulating layer 15 and optional buried insulating layer 44 are comprised of the same or different insulating material including, for example, a crystalline or non-crystalline oxide, nitride or any combination thereof. In some embodiments, buried insulating layer 15 is not present. Preferably, the buried insulating layers 15 and 44 are comprised of an oxide. It is noted that although buried insulating layers 15 and 44 can be comprised of the same insulating material, the two layers are not formed by the same process. Typically, buried insulating layer 15 is formed during the initial stages of the layer transfer process used to create the hybrid oriented substrate 12, while the second optional buried insulating layer is formed in later processing steps, e.g., by oxygen or nitrogen ion implantation.

In addition to the hybrid oriented substrate 12, each of the structures includes at least one CMOS device, i.e., FET, located on the different planar surfaces. Illustratively, FET 16A is located on the planar surface 14A, while FET 16B is located on the planar surface 14B. Each FET includes a gate dielectric (18A and 18B), a gate conductor (20A and 20B) and at least one sidewall spacer 22. Optionally, a passivation layer 24 is present on the sidewalls of at least the gate conductors. The gate dielectric (18A and 18B) present in each of the FETs can comprise the same or different insulating material. For example, gate dielectric (18A and 18B) can be comprised of an oxide, nitride, oxynitride or any combination thereof including multilayers. Preferably, the gate dielectric (18A and 18B) is comprised of an oxide such as, for example, $SiO_2$. The gate conductor (20A and 20B) can be comprised of the same or different conductive material, including, for example, polySi, SiGe, a metal, a metal alloy, a metal silicide, a metal nitride or combinations including multilayers thereof. When multilayers are present, a diffusion barrier (not shown), such as TiN or TaN, can be positioned between each of the conductive layers. A capping layer (also not shown), such as an oxide, or nitride, can be located atop the gate conductors of each of the FETs. The at least one spacer 22 that is present is typically comprised of an oxide, nitride or oxynitride including combinations and multilayers thereof. In embodiments in which passivation layer 24 is present, that layer is typically comprised of an oxide, nitride or oxynitride.

Each FET (16A and 16B) also includes S/D extensions (28A and 28B) and S/D regions (30A and 30B) which, together with the gate conductor (20A and 20B) define the length of the channel (32A and 32B). The S/D extensions and S/D regions are comprised of the first and second semiconductor material that have been doped with either n- or p-type dopants by ion implantation and/or by in-situ doping during epitaxial growth. The S/D extensions are typically shallower in depth than the S/D regions.

FIGS. 1-6 also show the presence of isolation regions 26 which are typically trench isolation regions that are comprised of at least a trench dielectric material such as an oxide. Alternatively, the isolation regions 26 may be field oxide isolation regions that are comprised of an oxide produced by a local oxidation of silicon process.

In some of the structures, e.g., see the structures shown in FIGS. 1, 6 and 7, stressed liners 34A and 34B are shown on top of portions of the hybrid oriented substrate 12 as well as at least one, preferably, both, of the FETs. The stressed liners 34A and 34B may comprise a single layer or multiple layers.

The stressed liners 34A and 34B are comprised of any stress inducing material such as a nitride or a high density plasma (HDP) oxide, or a combination thereof. The stressed liners can formed by various chemical vapor deposition (CVD) processes such as low pressure CVD (LPCVD), plasma enhanced CVD (PECVD), rapid thermal CVD (RTCVD) or BTBAS-based ($C_8H_{22}N_2Si$ reacted with ammonia) CVD, where BTBAS is a modern metalorganic precursor for CVD application. The later process provides a low temperature nitride film having high stress. The stress inducing materials can be under tensile stress (typically when the FET is an nFET) or compressive stress (typically when the stressed liner is on a pFET).

Preferably, the tensile strain inducing liner comprises a nitride, such as $Si_3N_4$, wherein the process conditions of the deposition process are selected to provide an intrinsic tensile strain within the deposited layer. For example, plasma enhanced chemical vapor deposition (PECVD) can provide nitride stress inducing liners having an intrinsic tensile strain. The stress state (tensile or compressive) of the nitride stress inducing liners deposited by PECVD can be controlled by changing the deposition conditions to alter the reaction rate within the deposition chamber. More specifically, the stress state of the deposited nitride strain inducing liner may be set by changing the deposition conditions such as: $SiH_4/N_2$/He gas flow rate, pressure, RF power, and electrode gap.

In another example, rapid thermal chemical vapor deposition (RTCVD) can provide nitride tensile strain inducing liners having an internal tensile strain. The magnitude of the internal tensile strain produced within the nitride tensile strain inducing liner deposited by RTCVD can be controlled by changing the deposition conditions. More specifically, the magnitude of the tensile strain within the nitride strain inducing liner may be set by changing deposition conditions such as: precursor composition, precursor flow rate and temperature.

In some embodiments of the present invention, e.g., see the structures shown in FIGS. 2, 6 and 7, embedded wells (38A and 38B) are present. The embedded wells can be present singly (not shown) or in combination (as shown in FIGS. 2, 6 and 7). The embedded wells (38A and 38B) are located within the source/drain regions (30A and 30B) are they are typically comprised of a semiconductor material that includes pure Si or Si containing C and/or Ge. Illustratively, the embedded wells can comprised SiC or SiGe. Typically, a C-containing well is used for nFETs, while a Ge-containing well is used for pFETs. These epitaxially grown embedded wells may be intrinsic or they may be doped with, for example, B, As, or P.

FIG. 7 shows a structure which includes stress inducing isolation regions 46. The stress inducing isolation regions 46 are comprised of a trench dielectric such as a highly stressed HDP oxide. In some embodiments, a trench fill material deposited from $O_3$/tetraethoxylonesilane (TEOS)-based subatmospheric CVD, in accordance, with the procedure described in R. Arghavani, et al. "Stress Management in Sub-90 nm Transistor Architecture", IEEE Transactions on Electronic Devices, Vol. 51, No. 10, October 2004, pg. 1740, the content of which is incorporated herein by reference, can be used alone or in conjunction with an HDP oxide. The procedure disclosed in the aforementioned article provides a TEOS based dielectric material.

Processing

In general terms, the present invention provides a process for fabricating the structure shown in FIGS. 1-7 which includes the steps of providing a hybrid oriented substrate having at least two planar surfaces of different crystallographic orientation, and forming at least one CMOS device, e.g., FET, on each of the planar surfaces of different crystallographic orientation, wherein each CMOS device has a stressed channel.

The first step of the present invention, i.e., providing a hybrid oriented substrate having at least two planar surfaces of different crystallographic orientation, is achieved by utilizing the processing steps described in U.S. patent application Ser. No. 10/250,241, filed Jun. 23, 2003 and U.S. patent application Ser. No. 10/696,634, filed Oct. 29, 2003 (the entire contents of each is incorporated herein by reference). In these disclosures, a bonding or layer transfer process is used to provide a structure comprising a first semiconducting wafer comprising a first semiconductor material having a first crystallographic orientation and a second semiconducting wafer comprising a second semiconductor material having a second crystallographic orientation which is different from the first crystallographic orientation. The bonding, i.e., layer transfer is typically achieved utilizing hydrophilic bonding in which an oxide (or another insulating material) is generally disposed on at least one of the semiconducting wafers prior to bonding. In some embodiments, a semiconductor to semiconductor direct bonding process or a hydrophobic bonding process can be used.

After the initial layer transfer process, a selective etching process is used to expose the bottom most semiconducting material and thereafter a semiconductor regrowth process is used which forms a semiconductor material of the same crystallographic orientation as the bottom most semiconducting wafer. During regrowth of the semiconducting material, different semiconductor materials such as layers 40 and 42 can be formed as appropriate. For example, it is possible to form a regrown semiconductor material that includes an upper region that comprises a strained semiconductor such as Si. Alternatively, a relaxed SiGe layer can be formed as the regrown material followed by the formation of a strained semiconductor layer such as strained Si.

Isolation regions, including the stress inducing isolation region, can be formed at this time of present invention utilizing processing well known to those skilled in the art including trench isolation formation by first defining a trench into the substrate via lithography and etching. Following the etching step, an optional trench dielectric liner and a trench dielectric are then formed into the trench. Alternatively, a local oxidation of silicon process can be used to define the trench.

After providing the semiconducting structure containing the at least two planar surfaces of different crystallographic orientation, at least one CMOS device, i.e., FET, is formed, on the active area of the hybrid oriented substrate. The FET formed on the active area is dependent on the type of crystallographic orientation that is present in the planar surface of the hybrid oriented substrate. For example, pFETs are formed into the crystallographic surface that is (110) oriented, while nFETs are formed into the crystallographic surface that is (100) oriented. These orientations represent the optimal orientations for pFETs and nFETs, respectively.

The FET is formed utilizing any conventional CMOS process that is capable of forming a FET. One method includes the steps of forming a layered stack comprising a gate dielectric and a gate conductor on each of the planar surfaces of the hybrid oriented substrate. The gate dielectric can be formed by a thermal process such as oxidation or by a conventional deposition process such as chemical vapor deposition (CVD), plasma enhanced CVD, evaporation, atomic layer deposition and other like deposition processes. The gate conductor is formed by a deposition process such as CVD, PECVD, sputtering, plating, evaporation, atomic layer deposition and the like. When polySi or SiGe gates are used, the conductive material can be doped in-situ or following deposition by ion implantation. Implantation masks and ion implantations are used to form the FETs of different conductivities. Following the formation of the layered stack, at least the gate conductor (and optionally the gate dielectric) is patterned by lithography and etching. A thermal process can then be used to form the passivation layer. Thereafter, S/D extensions are formed by ion implantation and annealing. Sidewalls spacers are then formed by deposition and etching and thereafter the S/D regions are formed by ion implantation and annealing. The annealing step used for activating the S/D extension can be omitted and activation can occur during the activation of the S/D regions.

In cases in which a stressed liner is present, the stressed liner is formed by deposition and etching, after the at least one CMOS device has been formed. Examples of deposition processes that can be used include, CVD, PECVD or RTCVD. The etching step includes providing a patterned resist over portions of the stressed inducing layer and then etching the exposed portions of the stressed liner. In the case that dual liners are used (tensile for nFET and compressive for pFET), the first liner is formed on first type of FETs (e.g., nFETs) and removed completely on the second type of FETs (e.g. pFETs) before the second liner is formed on the second type of FETs (pFETs). Then the second liner is removed from the first type of FETs (nFETs).

In cases in which the embedded wells are formed, the CMOS device is first provided in each of the active areas of different crystallographic orientation. Next, exposed portions of the hybrid oriented substrate are recessed by an etching process (RIE and/or wet etch), preferably to provide a slight undercut beneath each of the spacers. That is, a selective anisotropic or isotropic etching process can be used to remove portions of the hybrid oriented substrate. The isotropic etch provides the slight undercut beneath the spacers. The recessing in areas of different crystal orientations, i.e., (100) vs. (110) orientations, will have different etch rates. Following the recessing process in which an etch is used, the etched surfaces are cleaned utilizing any cleaning process that can remove contaminates including residual oxides from the recessed surfaces. A selective epitaxial growth process (RTCVD or UHVCVD) can than be used to form the embedded wells. In embodiments in which RTCVD (rapid thermal CVD) is used, the following conditions are typically used: deposition temperature of about 500° C. to about 1000° C., pressure from about 5 to about 100 Torr, and a precursor comprising a Si source such as a silane, a disilane, or a dichlorosilane, a Ge source such as $GeH_4$ or a C source such as an alkene. Alternatively, it is possible that the embedded wells can be formed by gas phase doping into the S/D regions.

The structures including the bi-axial strained channels are formed by choosing specific semiconductor material during the formation of the hybrid oriented substrate itself. This has been described above and thus further details are not provided herein.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method for fabricating a semiconductor structure having improved carrier mobility comprising:
   providing a hybrid oriented substrate having first and second planar surfaces comprising a first semiconductor material and a second semiconductor material, respectively, said first and second semiconductor materials comprising different crystallographic orientations, and
   forming at least one CMOS device on each of the planar surfaces of different crystallographic orientations wherein each CMOS device has a stressed channel and a stress inducing liner, wherein said stress inducing liner on said first planar surface is a tensile stress inducing material, said stress inducing liner on said second planar surface is a compressively stress inducing material.

2. The method of claim 1 wherein said providing said hybrid oriented substrate includes a wafer bonding process and selectively etching portions of the hybrid oriented substrate produced by wafer bonding to expose an underlying semiconductor material of one of the wafers used in wafer bonding, and regrowing at least one semiconductor material from said exposed surface.

3. The method of claim 1 wherein said forming said at least one CMOS device further comprises forming at least one of a stressed well and a stress inducing isolation region.

4. The method of claim 3 wherein said tensile stress inducing liner is formed atop a nFET that is present on a (100) crystal surface, and said compressively inducing stress liner is formed atop a pFET that is present on a (100) crystal surface.

5. The method of claim 3 wherein a stressed well that includes C is formed in said hybrid oriented substrate for a nFET that is located on a (100) crystal surface and a stressed well including Ge is formed in said hybrid oriented substrate for a pFET that is located on a (100) crystal surface.

6. The method of claim 1 wherein said stressed channel is a biaxial stressed channel formed by selecting specific semiconductor materials during the formation of the hybrid oriented substrate.

7. The method of claim 1 wherein said stressed channel is formed by a CVD deposited stress inducing liner comprising a nitride, a HDP oxide or a combination thereof.

8. The method of claim 1 wherein said stress channel is formed by a stressed well, said stressed well comprises pure Si, SiC or SiGe.

9. The method of claim 8 wherein said stressed well is formed by a process that includes an isotropic or anisotropic etching.

* * * * *